(12) United States Patent  
Sano et al.

(10) Patent No.: US 7,875,807 B2  
(45) Date of Patent: Jan. 25, 2011

(54) ELASTIC CONDUCTIVE RESIN, AND ELECTRONIC DEVICE INCLUDING ELASTIC CONDUCTIVE BUMPS MADE OF THE ELASTIC CONDUCTIVE RESIN

(75) Inventors: Takeshi Sano, Minami ashigara (JP); Hirofumi Kobayashi, Atsugi (JP); Hideaki Ohkura, Sagamihara (JP)

(73) Assignee: Ricoh Company, Ltd., Tokyo (JP)

( * ) Notice: Subject to any disclaimer, the term of this patent is extended or adjusted under 35 U.S.C. 154(b) by 741 days.

(21) Appl. No.: 11/673,904

(22) Filed: Feb. 12, 2007

(65) Prior Publication Data

US 2007/0132098 A1    Jun. 14, 2007

Related U.S. Application Data

(62) Division of application No. 10/619,632, filed on Jul. 16, 2003, now abandoned.

(30) Foreign Application Priority Data

Jul. 18, 2002    (JP)    ............... 2002-210181

(51) Int. Cl.  
*H05K 1/02*    (2006.01)
(52) U.S. Cl. ...................... 174/259; 174/260
(58) Field of Classification Search .......... 174/259, 174/260  
See application file for complete search history.

(56) References Cited

U.S. PATENT DOCUMENTS

| 4,568,592 A | 2/1986 | Kawaguchi et al. |
| 4,701,279 A | 10/1987 | Kawaguchi et al. |
| 4,740,657 A | 4/1988 | Tsukagoshi et al. |
| 5,604,026 A | 2/1997 | King |
| 5,624,268 A | 4/1997 | Maeda et al. |
| 5,686,703 A | 11/1997 | Yamaguchi |
| 5,738,936 A | 4/1998 | Hanrahan |
| 6,020,059 A | 2/2000 | Yamada et al. |
| 6,156,427 A | 12/2000 | Gotoh et al. |
| 6,243,147 B1 | 6/2001 | Sano |
| 6,281,450 B1 | 8/2001 | Urasaki et al. |
| 6,384,128 B1 | 5/2002 | Wadahara et al. |

(Continued)

FOREIGN PATENT DOCUMENTS

JP    64-23600    1/1989

(Continued)

OTHER PUBLICATIONS

Machine translation of JP2004-051755 (Feb. 2004).*

(Continued)

*Primary Examiner*—Jeremy C Norris  
(74) *Attorney, Agent, or Firm*—Oblon, Spivak, McClelland, Maier & Neustadt, L.L.P.

(57) ABSTRACT

An electronic device includes an electronic part including at least one first electrode, a substrate including at least one second electrode, and at least one bump formed on the at least one first electrode and formed from an elastic conductive resin including a resin having rubbery elasticity, and an acicular conductive filler including a surface layer coated with one of gold, silver, nickel, and copper. The at least one first electrode and the at least one second electrode are electrically connected to each other by mechanically contacting the at least one bump with the at least one second electrode.

15 Claims, 7 Drawing Sheets

U.S. PATENT DOCUMENTS

| | | | |
|---|---|---|---|
| 6,472,247 B1 | 10/2002 | Andoh et al. | |
| 6,533,963 B1 | 3/2003 | Schleifstein et al. | |
| 6,884,833 B2 | 4/2005 | Chheang et al. | |
| 6,900,550 B2 | 5/2005 | Yamazaki et al. | |
| 6,936,783 B2 | 8/2005 | Kawaguchi et al. | |
| 6,956,072 B1 | 10/2005 | Kanaka et al. | |
| 2004/0074671 A1* | 4/2004 | Hirano et al. | 174/267 |
| 2004/0108133 A1* | 6/2004 | Sano et al. | 174/260 |

FOREIGN PATENT DOCUMENTS

| | | | |
|---|---|---|---|
| JP | 1-148515 | | 6/1989 |
| JP | 2-60945 | | 3/1990 |
| JP | 2-103944 | | 4/1990 |
| JP | 4-6841 | | 1/1992 |
| JP | 10-242616 | | 9/1998 |
| JP | 10-256304 | | 9/1998 |
| JP | 2002-541616 | | 12/2002 |
| JP | 2004-05175 A | * | 2/2004 |
| JP | 2004-165066 A | * | 6/2004 |
| WO | WO 00/47660 | | 8/2000 |

OTHER PUBLICATIONS

Machine translation of JP2004-165066 (Jun. 2004).*

Fukuda Metal Foil & Powder Co., Ltd., No. 6116, pp. 2-8, "Metal Powder" Complete Catalog of Metal Powders.

Huawu Wu, et al., Studies on high molecule electrically conductive film containing tetrapod-like ZnO whiskers, 1999,304(4), 1995-2006 Tsinghua Tongfang Optical Disc Co., Ltd., pp. 398-390 (with English translation).

* cited by examiner

ELASTIC CONDUCTIVE RESIN, AND ELECTRONIC DEVICE INCLUDING ELASTIC CONDUCTIVE BUMPS MADE OF THE ELASTIC CONDUCTIVE RESIN

CROSS-REFERENCE TO RELATED APPLICATIONS

The present Application is a divisional application of U.S. application Ser. No. 10/619,632 filed on Jul. 16, 2003 now abandoned. The present application claims priority to U.S. application Ser. No. 10/619,632, filed on Jul. 16, 2003, and to Japanese Patent Application No. 2002-210181 filed in the Japanese Patent Office on Jul. 18, 2002.

BACKGROUND OF THE INVENTION

1. Field of the Invention

The present invention relates to an elastic conductive resin, and an electronic device in which an electronic part and a substrate are electrically connected to each other via elastic conductive bumps made of the elastic conductive resin.

2. Discussion of the Background

Figure 1A:
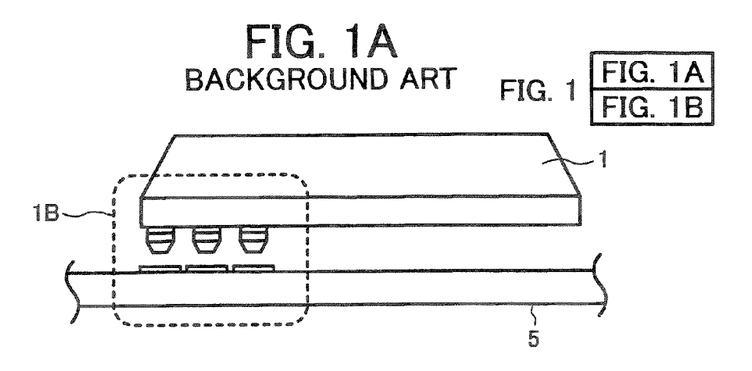
FIG. 1A is a cross section of a background integrated circuit package including an IC chip and a circuit board.
Figure 1B:
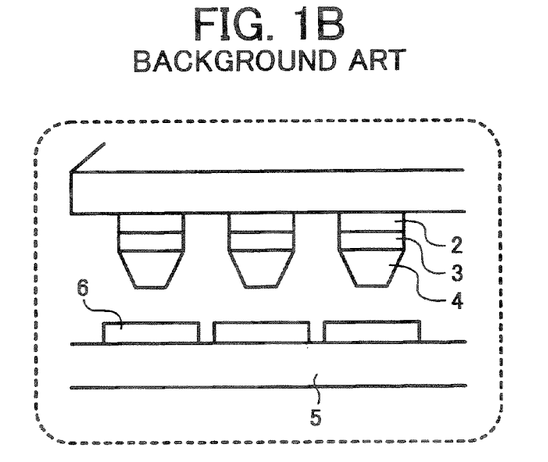
FIG. 1B is an enlarged view of bump seats, conductive adhesive agents, elastic conductive resin bumps, and part mounting seats in the background integrated circuit package of FIG. 1A.

Published Japanese patent application 10-242616 describes an integrated circuit (IC) package in which a circuit board and an IC chip are connected to each other with high reliability without filling a sealing resin into a gap between the circuit board and the IC chip. Specifically, as illustrated in FIGS. 1A and 1B, a plurality of bump seats 2 are provided on a bottom part of an IC chip 1. Conductive adhesive agents 3 connect the bump seats 2 to elastic conductive resin bumps 4, respectively. Generally, a conductive bump is a projecting electrode formed at an electrode part of a chip for wireless bonding in an integrated circuit. The elastic conductive resin bump 4 is made of a material in which a conductive powder (e.g., a filler) is mixed with a silicone resin. The volume ratio between the silicone resin and the conductive powder is two to one. The conductive powder is, for example, a copper powder subjected to gold plating and having a diameter in a range of 180 μm to 200 μm. The elastic conductive resin bump 4 adsorbs stresses due to heat and mechanical distortions. A plurality of part mounting seats 6 are provided on an upper part of a circuit board 5 and are electrically connected to the elastic conductive resin bumps 4, respectively.

Another piece of background art with regard to an electronic device using an elastic conductive resin is Published Japanese patent application 10-256304. Specifically, in a semiconductor device illustrated in FIG. 2, a conductive adhesive agent 15 having rubbery elasticity is applied to each of projecting electrodes 13 provided on a functional surface of a semiconductor integrated circuit chip 11. The conductive adhesive agent 15 is made of conductive particles and a heat-curing resin. The semiconductor integrated circuit chip 11 is mounted on an insulating substrate 12 while positioning the projecting electrodes 13 and substrate electrodes 14 provided on the insulating substrate 12. A sealing resin 16 is filled into a gap between the semiconductor integrated circuit chip 11 and the insulating substrate 12 and is cured and contracts. The projecting electrodes 13 and the substrate electrodes 14 are electrically connected to each other via the conductive adhesive agent 15.

Figure 2:
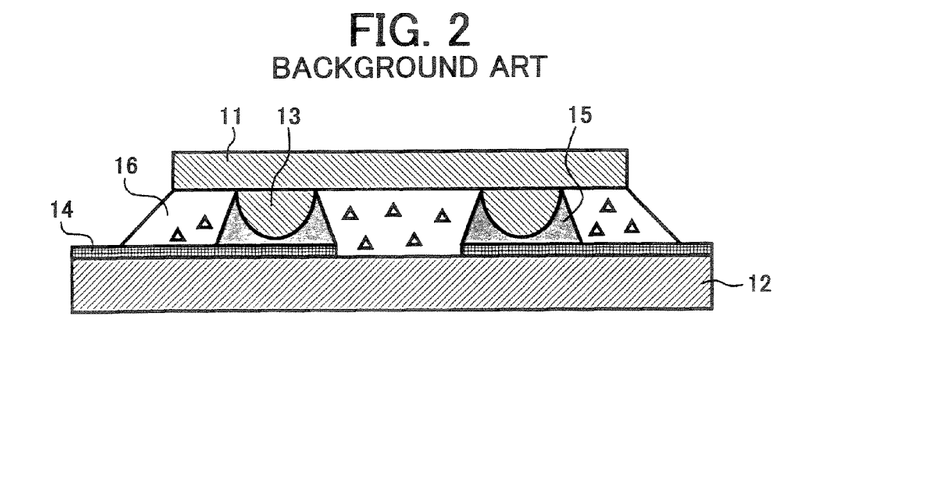
FIG. 2 is a cross section of a background semiconductor device.

According to Published Japanese patent application 10-256304, after the conductive adhesive agent 15 is cured, even if a shearing stress is imposed on the conductive adhesive agent 15 caused by the difference of the thermal expansion coefficient between the semiconductor integrated circuit chip 11 and the insulating substrate 12 as they are cooling, the conductive adhesive agent 15 does not break and separate from the substrate electrodes 14 because the conductive adhesive agent 15 moderates the shearing stress. Further, because the conductive adhesive agent 15 does not prevent a longitudinal stress caused by the cured and contacted sealing resin 16, the projecting electrodes 13 and substrate electrodes 14 are press-contacted to each other through the conductive particles in the conductive adhesive agent 15, thereby achieving a good electrical connection.

Generally, when mounting an IC chip on a substrate, the IC chip and the substrate are connected to each other by solder. In this case, under the condition of temperature changes, stresses due to the difference in thermal expansion coefficient between the IC chip and the substrate occur at the connection part between the IC chip and the substrate. Therefore, to avoid trouble such as breakage of the connection part, a resin is used for reinforcing the connection part.

In an electronic device having multiple pins and a large size, an IC chip and a substrate are connected to each other by using a conductive adhesive agent having rubbery elasticity. In this type of the electronic device, to ensure moderation in the stress due to the difference in thermal expansion coefficient between the IC chip and the substrate, a sealing resin is necessary as a reinforcement for filling a gap between the IC chip and the substrate.

In an electronic device in which a plurality of bumps made of an elastic conductive resin are formed on an IC chip, and the IC chip and a substrate are electrically connected to each other by press-contacting the bumps with electrodes provided on the substrate; the bumps need to contact with the electrodes formed on the substrate, especially, in an area array state, with a large press-contacting force. Further, if the bumps have uneven height, press-contacting forces are not equally exerted on the bumps, thereby causing an unstable electrical connection between the IC chip and the substrate.

In the background electronic devices, an elastic conductive resin used for forming bumps often includes a silicone resin having rubber-like elasticity and containing spherical conductive particles or flake conductive fillers. To obtain high conductivity by using the spherical conductive particles or flake conductive fillers, the compounding ratio of the flake conductive filler in the silicone resin needs to be increased. However, if the amount of the flake conductive filler increases in the silicone resin, the silicone resin hardens due to the flake conductive filler. In this condition, the silicone resin cannot exhibit a good rubber-like elasticity property. If an IC chip and a substrate are electrically connected to each other via the bumps made of the silicone resin without having a sufficient rubber-like elasticity property, the bumps need to contact with electrodes formed on the substrate with a large press-contacting force. Further, the bumps need to be controlled with high accuracy to have equal height.

Therefore, it is desirable to provide an elastic conductive element, such as, an elastic conductive bump, that has high deformation ability against a compression force and high conductivity.

SUMMARY OF THE INVENTION

According to one aspect of the present invention, an elastic conductive resin includes a resin having rubbery elasticity and an acicular conductive filler having a surface layer coated with one of gold, silver, nickel, and copper.

According to another aspect of the present invention, an electronic device includes an electronic part including at least one first electrode, a substrate including at least one second electrode, and at least one bump formed on the at least one first electrode and formed from an elastic conductive resin including a resin having rubbery elasticity, and an acicular conductive filler including a surface layer coated with one of gold, silver, nickel, and copper. The at least one first electrode and the at least one second electrode are electrically connected to each other by mechanically contacting the at least one bump with the at least one second electrode.

According to further aspect of the present invention, an electronic device includes an electronic part including at least one first electrode, a substrate including at least one second electrode, and at least one bump formed on the at least one first electrode and formed from an elastic conductive resin including a resin having rubber-like elasticity, and a tetrapod-shaped zinc oxide filler including a surface layer coated with one of gold, silver, nickel, and copper. The at least one first electrode and the at least one second electrode are electrically connected to each other by mechanically contacting the at least one bump with the at least one second electrode.

The at least one bump may be formed on the at least one second electrode of the substrate instead of or in addition to the at least one first electrode of the electronic part.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 3:
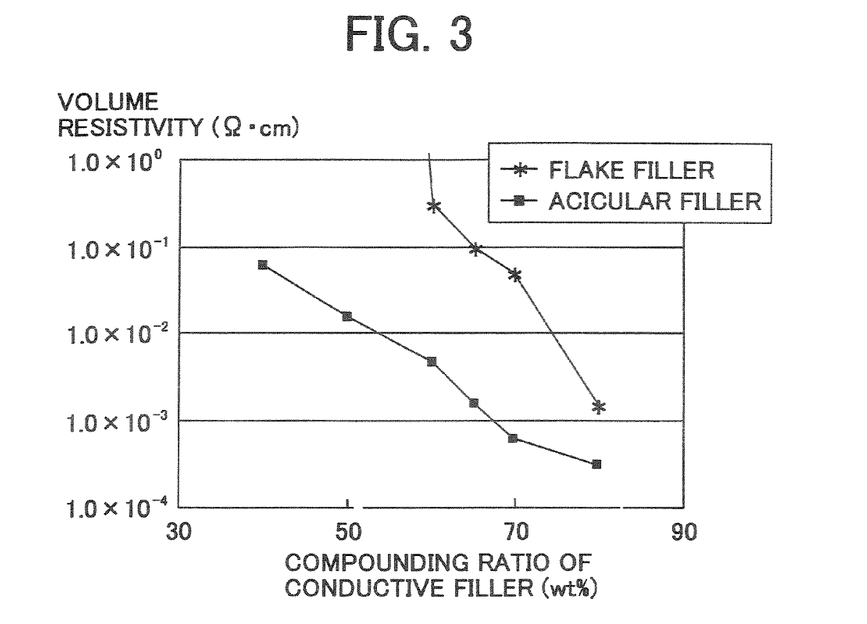
FIG. 3 is a graph showing a relationship between a volume resistivity of a conductive rubber-like elastic resin and a compounding ratio of a conductive filler in the conductive rubber-like elastic resin when comparing a flake conductive filler and an acicular filler based on experimental results.
Figure 4:
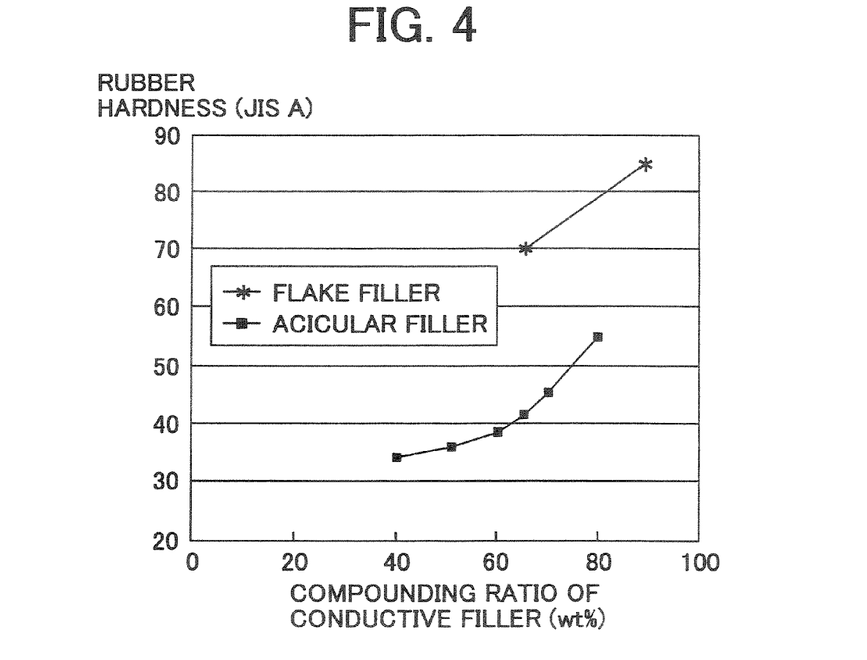
FIG. 4 is a graph showing a relationship between rubber hardness of a conductive rubber-like elastic resin and a compounding ratio of a conductive filler in the conductive rubber-like elastic resin when comparing a flake conductive filler and an acicular filler based on experimental results.

Preferred embodiments of the present invention are described in detail referring to the drawings, wherein like reference numerals designate identical or corresponding parts throughout the several views. FIG. 3 is a graph showing a relationship between a volume resistivity of a conductive rubber-like elastic resin and a compounding ratio of a conductive filler in the conductive rubber-like elastic resin when comparing a flake conductive filler and an acicular filler based on experimental results. FIG. 4 is a graph showing a relationship between rubber hardness prescribed in JIS A (Japanese Industrial Standards) of a conductive rubber-like elastic resin and a compounding ratio of a conductive filler in the conductive rubber-like elastic resin when comparing a flake conductive filler and an acicular filler based on experimental results.

In this embodiment, a silicone resin is used as the conductive rubber-like elastic resin and contains an acicular conductive filler or a flake conductive filler. The silicone resin has a heat-curing property and a rubber hardness of 28 prescribed in JIS A (Japanese Industrial Standards). The acicular conductive filler is formed from a material in which an inorganic compound whisker is plated with silver (Ag). The acicular conductive filler has a diameter of about 0.5 μm and a length of about 20 μm. The flake conductive filler has a diameter in a range of about 10 μm to about 20 μm. The acicular conductive filler or flake conductive filler is mixed and dispersed in the silicone resin.

As seen from FIGS. 3 and 4, as compared to the conductive rubber-like elastic resin containing the flake conductive filler, the conductive rubber-like elastic resin containing the acicular filler has a greater electrically conductive and less rubber hardness.

Figure 5:
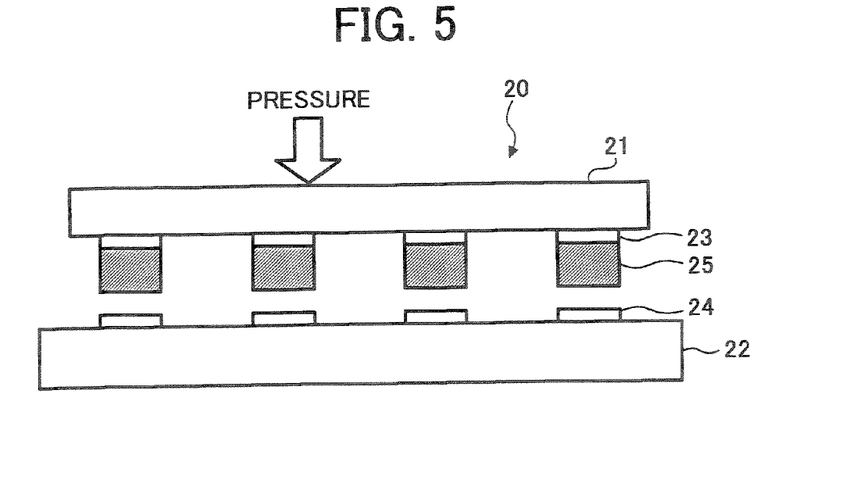
FIG. 5 is a schematic cross section of an electronic device in which an electronic part and a substrate are electrically connected to each other via elastic conductive bumps according to one embodiment of the present invention.

FIG. 5 is a schematic cross section of an electronic device in which an electronic part and a substrate are electrically connected to each other via elastic conductive bumps according to one embodiment of the present invention. In this embodiment, an electronic device 20 includes an electronic part 21 and a substrate 22 electrically connected to each other. Specifically, a plurality of electrodes 23 are provided on the lower surface of the electronic part 21. A conductive rubber-like elastic resin containing an acicular conductive filler including a surface layer coated with gold, silver, nickel, or copper, is formed into a shape of a bump (hereafter referred to as an elastic conductive bump 25) and is provided on each of the electrodes 23. The acicular conductive filler is like a fiber and provides a three-dimensional mesh construction in the conductive rubber-like elastic resin. Further, a plurality of electrodes 24 plated with gold are provided on the upper surface of the substrate 22. The electrodes 23 provided on the electronic part 21 and the electrodes 24 provided on the substrate 22 are electrically connected to each other by mechanically contacting the elastic conductive bumps 25 with the electrodes 24.

As described above referring to FIGS. 3 and 4, the elastic conductive bump 25 formed from the conductive rubber-like elastic resin containing the acicular conductive filler has a superior deforming ability and a high electric conductive. The aspect ratio of the acicular conductive filler is relatively high. Therefore, when the conductive rubber-like elastic resin is deformed, the acicular conductive filler moves with the resin. Thus, the high elasticity of the resin can be maintained. Further, because the aspect ratio of the acicular conductive filler is relatively high, the acicular conductive filler can provide the resin with high conductivity even when the compounding ratio of the acicular conductive filler in the resin is low. Therefore, a content amount of a conductive filler in a resin can be decreased. As described above, the conductive rubber-like elastic resin containing the acicular conductive filler exhibits sufficient elasticity and stable and high conductivity.

The elastic conductive bump 25 formed from such a conductive rubber-like elastic resin containing the acicular conductive filler sufficiently deforms when applying a compression force to the elastic conductive bump 25. With such elastic conductive bumps 25, even when the elastic conductive bumps 25 are connected to the electrodes 24 on the substrate 22 which are arranged in an area array state, the elastic conductive bumps 25 can stably contact with the electrodes 24 on the substrate 22 with light weight. Therefore, in the electronic device 20 according to the present embodiment, the electronic part 21 and the substrate 22 can be electrically connected to each other with a high stability by mechanically contacting the elastic conductive bumps 25 with the electrodes 24 with a simple construction. Further, an allowable range of dispersion of height of elastic conductive bumps can extend.

Figure 6:
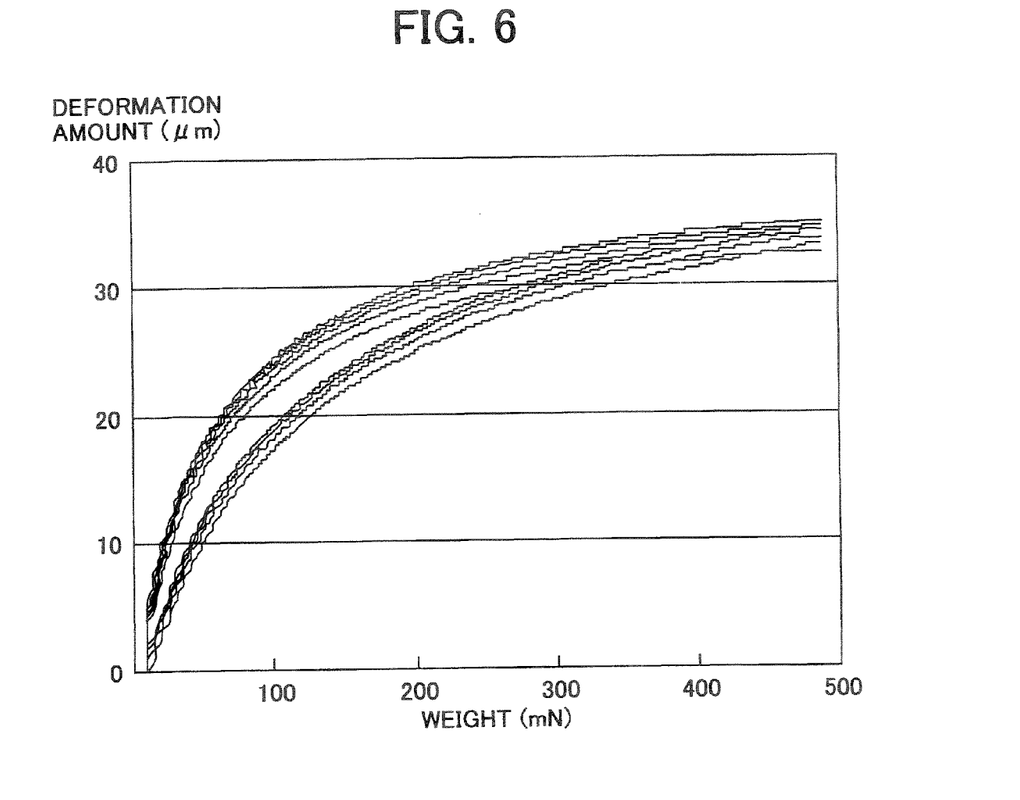
FIG. 6 is a graph showing a relationship between a deformation amount of an elastic conductive bump and weight applied to the elastic conductive bump based on experimental results.
Figure 7:
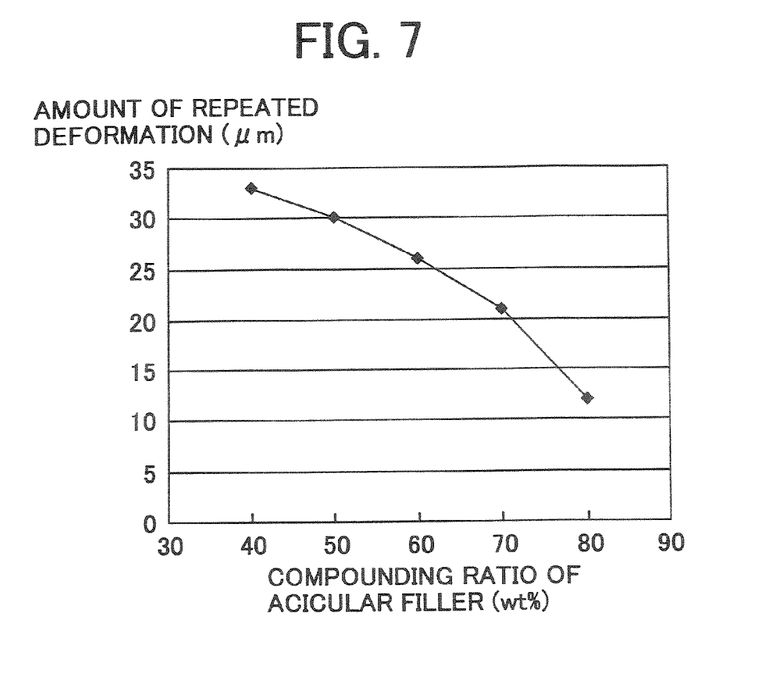
FIG. 7 is a graph showing a relationship between an amount of repeated deformation of an elastic conductive bump and a compounding ratio of an acicular filler in a conductive rubber-like elastic resin based on experimental results.

Experiments for an evaluation of compression deformation characteristic and contact resistance of an elastic conductive bump, which is formed from an elastic conductive resin and has a diameter of about 0.5 mm and a height of about 0.15 mm, were performed. Experiments were performed by repeatedly applying weight of from about 9.8 mN to about 490 mN to an elastic conductive bump by using an indenter having a diameter of about 0.5 mm. FIG. 7 is a graph showing a relationship between an amount of repeated deformation of an elastic conductive bump and a compounding ratio of an acicular conductive filler in a conductive rubber-like elastic resin based on experimental results. FIG. 6 is a graph showing a relationship between a deformation amount of an elastic conductive bump and weight applied to the elastic conductive bump based on experimental results when the amount of the acicular conductive filler added in the conductive rubber-like elastic resin is 40% by weight. As seen from FIG. 6, the elastic conductive bump elastically deforms, and the deformation amount of the elastic conductive bump under the repeated compression is stable.

Figure 8:
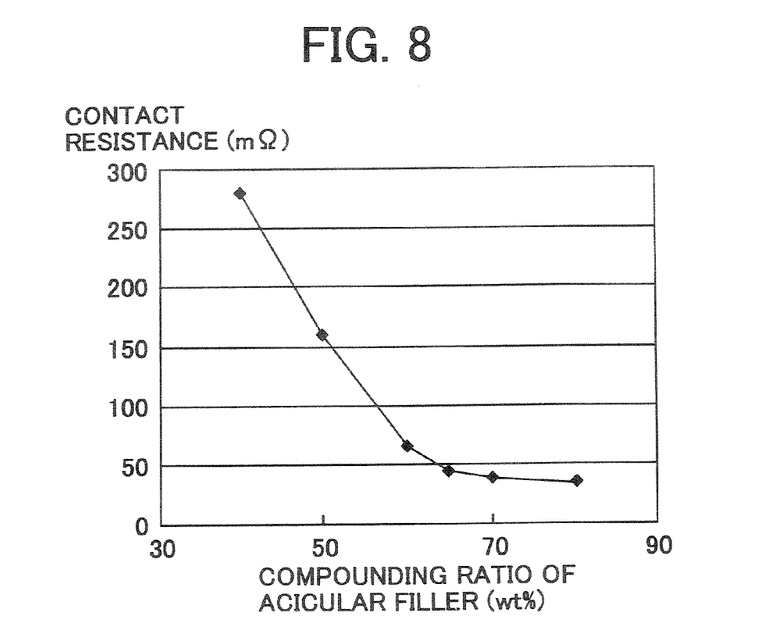
FIG. 8 is a graph showing a relationship between contact resistance of an elastic conductive bump and a compounding ratio of an acicular filler in a conductive rubber-like elastic resin based on experimental results.

A relationship between contact resistance of the elastic conductive bump pressed against the electrode 24 on the substrate 22 under the weight of about 490 m and a compounding ratio of acicular conductive filler in a conductive rubber-like elastic resin based on experimental results is shown in a graph of FIG. 8.

According to the experimental results, it is shown that the elastic conductive bump formed from a conductive rubber-like elastic resin including acicular fillers deforms under light weight and exhibits stable elastic deformation characteristic even if compression is repeatedly applied to the elastic conductive bump. Further, it is shown that the contact resistance of the elastic conductive bump pressed against the electrode 24 on the substrate 22 is relatively low.

The compounding ratio of acicular conductive fillers in a conductive rubber-like elastic resin may be selected according to the desired elastic deformation amount and contact resistance of an elastic conductive bump while referring to the above-described evaluation results. As described above, the electrodes 23 on the electronic part 21 and the electrodes 24 on the substrate 22 are electrically connected to each other by mechanically contacting the elastic conductive bumps 25 with the electrodes 24. Therefore, the electronic part 21 on which the elastic conductive bumps 25 are formed is easily detached from and attached to the substrate 22. Thus, the electronic part 21 can be reused.

Figure 9:
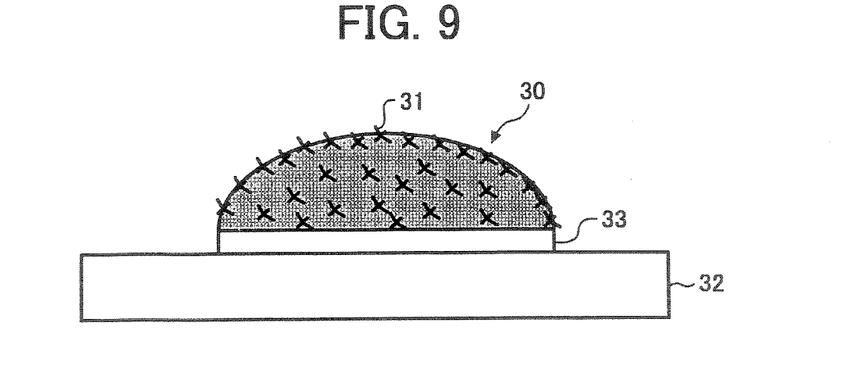
FIG. 9 is a schematic view of an elastic conductive bump formed from a conductive rubber-like elastic resin containing tetrapod-shape conductive fillers.

FIG. 9 illustrates an elastic conductive bump 30 formed from a conductive rubber-like elastic resin containing tetrapod-shape conductive fillers 31. The tetrapod-shape conductive filler 31 is made of zinc oxide crystallization coated with various types of metal, such as, for example, gold, silver, nickel, and copper, to apply conductivity. The zinc oxide crystallization is grown from a barycenter of a regular tetrahedron towards four summits. The average length of an acicular portion of the tetrapod-shape conductive filler 31 is about 20 µm, and the average diameter of the acicular portion of the tetrapod-shape conductive filler 31 is about 1 µm. A number of acicular portions of the tetrapod-shape conductive filler 31 project from the surface of the elastic conductive bump 30. As illustrated in FIG. 9, the elastic conductive bump 30 is provided on an electronic part 32 via an electrode 33.

When the elastic conductive bump 30 is pressed against an opposite electrode (not shown) provided on a substrate (not shown), the elastic conductive bump 30 deforms, and the acicular portions of the tetrapod-shape conductive filler 31 projecting from the surface of the elastic conductive bump 30 slip on the surface of the opposite electrode on the substrate. In this condition, even if the surface of the opposite electrode is oxidized or stained, oxide films and stains on the surface of the opposite electrode are removed by the acicular portions of the tetrapod-shape conductive filler 31, and thereby the leading edge of each of the acicular portions of the tetrapod-shape conductive filler 31 surely contacts with the conductive surface of the opposite electrode on the substrate. As Thus, the contact resistance of the elastic conductive bump 30 relative to the opposite electrode is stabilized.

When a cross-section of an elastic conductive bump is in a shape in which the elastic conductive bump becomes gradually thin toward a tip portion of the elastic conductive bump, because the tip portion of the elastic conductive bump is thin, the deformation amount of the tip portion of the elastic conductive bump is large relative to the compression force applied to the tip portion of the elastic conductive bump. Thus, the deformation amount of the elastic conductive bump relative to the compression force applied to the overall elastic conductive bump increases. Therefore, a pressing force applied to the elastic conductive bump for mechanically contacting the elastic conductive bump with an electrode can be reduced, and thereby an allowable range of dispersion of height of elastic conductive bumps can extend.

Figure 10A:
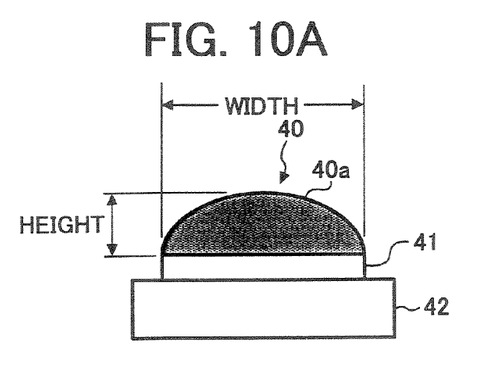
FIG. 10A is a schematic view of a cured cup-shaped elastic conductive bump.
Figure 11:
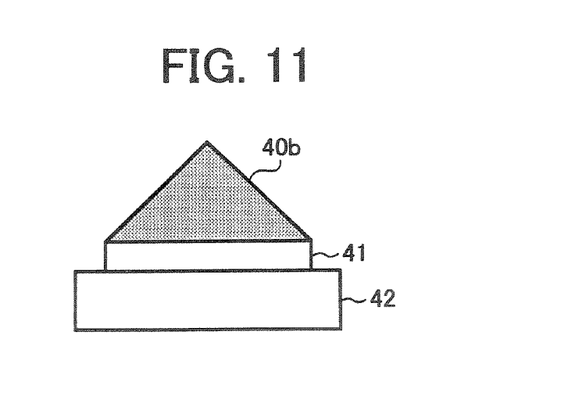
FIG. 11 is a schematic view of a cone-shaped elastic conductive bump according to an alternative example.

For example, the cross-section of an elastic conductive bump may be in a shape of a round cup as illustrated in FIG. 10A. Alternatively, the same effect can be obtained if the cross-section of an elastic conductive bump made of an elastic conductive resin 40b is in a shape of a cone as illustrated in FIG. 11. If the aspect (length to width) ratio of the elastic conductive bump is less than 0.1, a desired compression deformation amount of the elastic conductive bump can not be obtained. In this condition, a plurality of the elastic conductive bumps cannot stably and electrically connect to a plurality of electrodes. If the aspect ratio of the elastic conductive bump is greater than 1.0, the elastic conductive bumps are slanted, thereby increasing the dispersion of contact resistance of the elastic conductive bumps and contacting with adjacent electrodes resulting in a short circuit condition.

Next, a material and a method of forming a cup-shaped elastic conductive bump at low cost will be described.

The material for the cup-shaped elastic conductive bump includes a heat-curing silicone resin including acicular conductive fillers and diluent added to the heat-curing silicone resin. As described above, the acicular conductive filler can provide the resin with high conductivity even when the compounding ratio of the acicular conductive filler in the resin is low. For this reason, a compounding ratio of resin is relatively high in this heat-curing silicone resin.

Figure 10B:
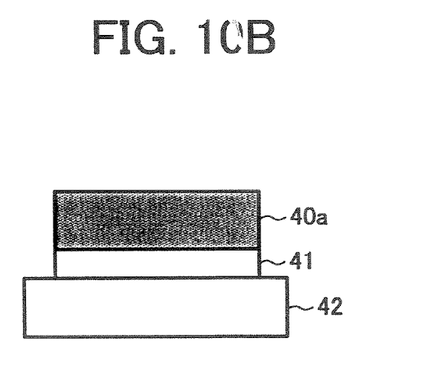
FIG. 10B is a view showing a state in which an elastic conductive resin is supplied onto an electrode provided on an electronic part by a screen printing method.

Referring to FIG. 10B, an elastic conductive resin 40a is supplied onto an electrode 41 provided on an electronic part 42 by a screen printing method. By heat-curing the elastic conductive resin 40a on the electrode 41, the elastic conductive resin 40a is formed into a shape of a bump, and thereby an elastic conductive bump 40 is obtained as illustrated in FIG. 10A. Even if the shape of the elastic conductive resin 40a supplied onto the electrode 41 is indefinite, the cup-shaped elastic conductive bump 40 can be formed under the action of surface tension of the resin and the diluent because viscosity of the elastic conductive resin 40a lowers at an initial stage of a high temperature condition during the heat-curing process. Thus, the cup-shaped elastic conductive bump 40 having high elasticity can be efficiently formed by supplying the elastic conductive resin 40a on the electrode 41 by a screen printing method. As bumps can be mass-produced by using the screen printing method, bumps can be formed at low costs.

However, due to the diluent contained in the elastic conductive resin, if the elastic conductive resin is cured by heat while raising the temperature of the elastic conductive resin to complete curing temperature, voids are formed in the elastic conductive bump, thereby making the elastic conductive bump into a high resistance state. Therefore, it is preferable that the elastic conductive resin be heated at a temperature lower than the complete curing temperature at the initial stage of a heat-curing process while evaporating the diluent slowly. Then, the elastic conductive resin should be cured until the temperature of the elastic conductive resin reaches the complete curing temperature.

Figure 12A:
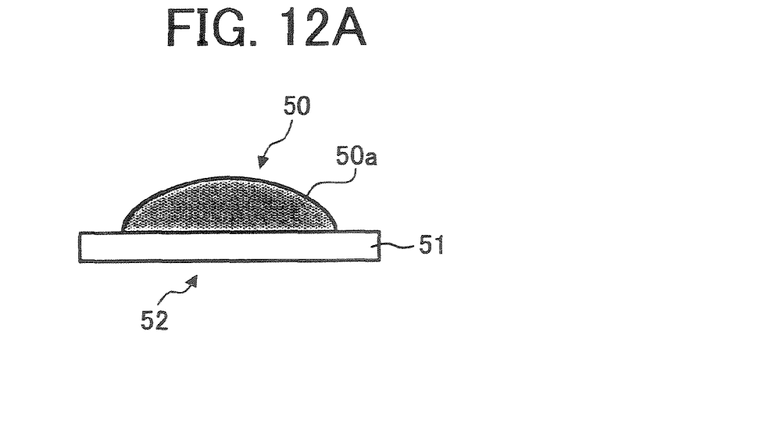
FIG. 12A is a schematic view of a connection part in which a metallic foil is attached on a cup-shaped elastic conductive bump.
Figure 12B:
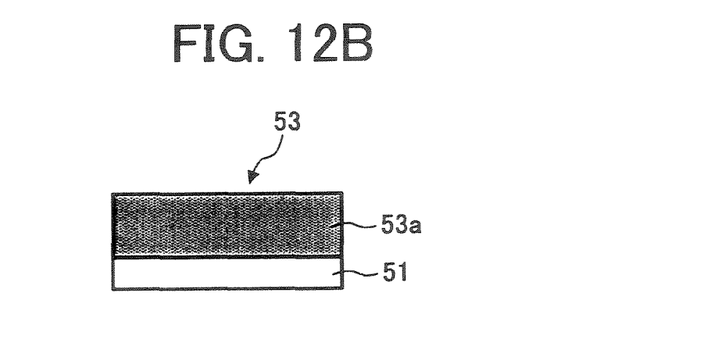
FIG. 12B is a schematic view of an elastic conductive bump with a metallic foil formed by a humidity-curing method.

FIGS. 12A and 12B illustrate an elastic conductive element, i.e., an elastic conductive bump on which a metallic foil is attached according to another embodiment. Referring to FIG. 12A, a metallic foil 51 is attached on one side of an elastic conductive bump 50 formed from an elastic conductive resin 50a in which diluent is added to a heat-curing silicone resin including acicular conductive fillers. The material for the elastic conductive bump 50 is the same as that of the elastic conductive bump 40 in FIG. 10A. The metallic foil 51 may include a copper foil. However, to reduce the contact resistance between the metallic foil 51 and the elastic conductive bump 50, it is preferable that the surface layer of the metallic foil 51 be plated with gold or silver.

Figure 12C:
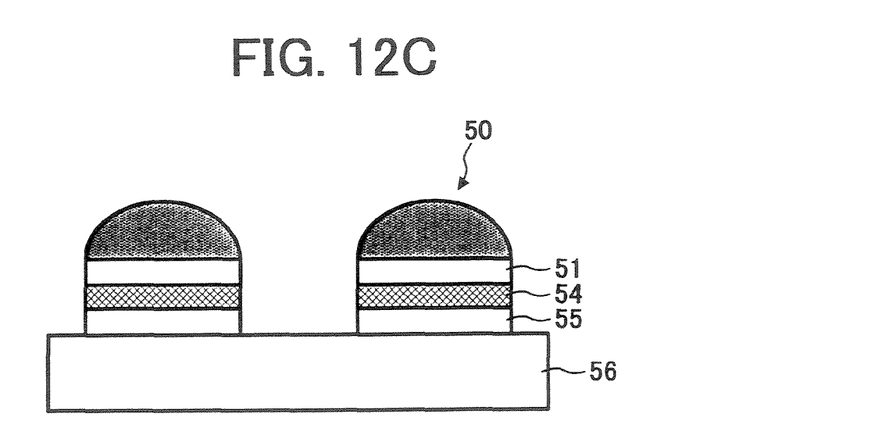
FIG. 12C is a schematic view of the connection part of FIG. 12A provided on an electrode on an electronic part via solder.

The elastic conductive bump 50 with the metallic foil 51 is effective when forming an elastic conductive bump on a three-dimensional construction, especially in a construction in which it is difficult to form a bump by directly supplying an elastic conductive resin onto an electrode. By making the elastic conductive bump 50 with the metallic foil 51 as one connection part 52, the connection part 52 can be provided on a three-dimensional construction by soldering or by using conductive adhesive agent. For example, as illustrated in FIG. 12C, the connection part 52 constructed from the elastic conductive bump 50 with the metallic foil 51 is provided on an electrode 55 via solder 54. The electrode 55 is provided on an electronic part 56.

When a cured elastic conductive bump is connected to an electrode in a three-dimensional construction, the cured elastic conductive bump cannot be connected to the electrode by soldering. Further, because an elastic resin in the cured elastic conductive bump has inferior adhesion property, even if the cured elastic conductive bump is connected to the electrode by using conductive adhesive agent, the elastic conductive bump cannot be connected to the electrode sufficiently. However, with a connection part constructed from an elastic conductive bump with a metallic foil, the elastic conductive bump can be efficiently and fixedly connected to an electrode.

Next, a method of forming an elastic conductive element (i.e., an elastic conductive bump) with a metallic foil will be described. An elastic conductive resin is coated on the metallic foil 51 at a predetermined thickness and is cured. As a curing method, known methods, such as, a heat-curing method and a humidity-curing method, may be employed according to the kinds of rubber-like elastic resin.

When forming the cup-shaped elastic conductive bump 50, the elastic conductive resin 50a is supplied onto the metallic foil 51 by a screen printing method. By heat-curing the elastic conductive resin 50a on the metallic foil 51, the elastic conductive resin 50a is formed into the cup-shaped bump 50 as illustrated in FIG. 12A. Alternatively, an elastic conductive resin 53a is coated on the metallic foil 51 at a predetermined thickness and is cured by a humidity-curing method. As a result, an elastic conductive bump 53 is obtained as illustrated in FIG. 12B.

Figure 13A:
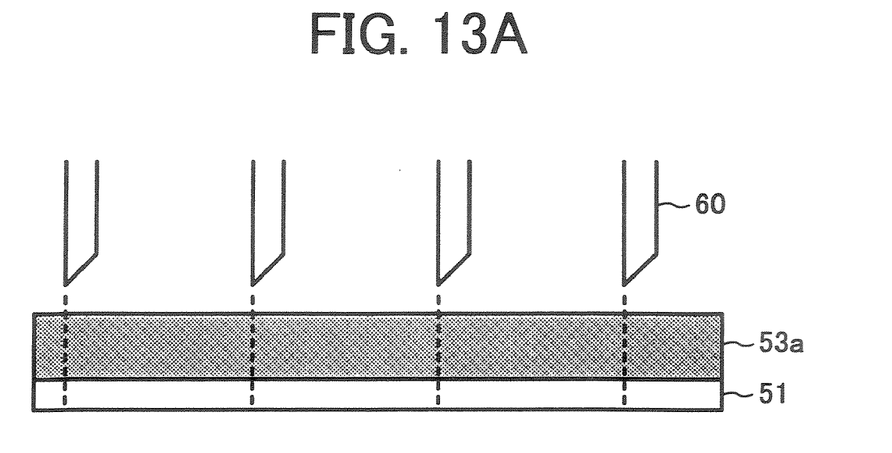
FIG. 13A is a view for explaining how an elastic conductive resin with a metallic foil is cut.

For example, after curing the elastic conductive resin 53a, the elastic conductive resin 53a and the metallic foil 51 are cut together with a cutter blade 60 in a predetermined size as illustrated in FIG. 13A. As a result, a connection part constructed from an elastic conductive bump with a metallic foil is formed.

Figure 13B:
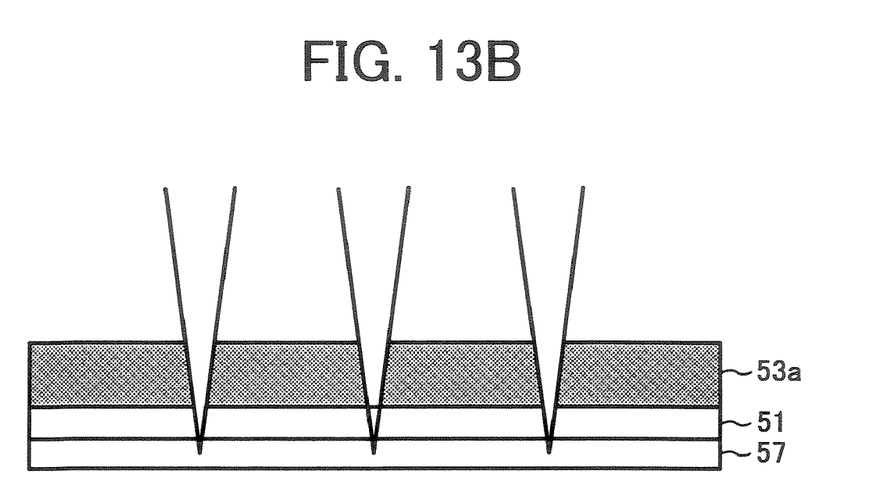
FIG. 13B is a view for explaining how the elastic conductive resin and the metallic foil with an adhesive tape are cut according to an alternative example.

As an alternative example, referring to FIG. 13B, an adhesive tape 57, in which an adhesion force is lost by ultraviolet radiation, may be attached on a rear surface of the metallic foil 51. When cutting the elastic conductive resin 53a, the metallic foil 51, and the adhesive tape 57, the adhesive tape 57 is cut such that a part of the adhesive tape 57 remains (i.e., the adhesive tape 57 is not cut completely). By this cutting, cut pieces of the elastic conductive bump 53 with the metallic foil 51 are prevented from separating each other after a cutting process. When the cut piece of the elastic conductive bump 53 with the metallic foil 51 is used for providing on an electrode, the elastic conductive bump 53 with the metallic foil 51 can be separated from the adhesive tape 57 as one connection part, by radiating an ultraviolet ray from the rear surface side of the adhesive tape 57. Thus, by using the adhesive tape 57, the workability of forming a connection part constructed from an elastic conductive bump with a metallic foil can be enhanced.

As an alternative example of the above-described conductive rubber-like elastic resin, an elastic conductive resin may include a silicone resin having an ultraviolet-curing property and a humidity-curing property and containing acicular fillers. This alternative elastic conductive resin can obtain high conductivity even if the content amount of conductive filler is small. Further, because the alternative elastic conductive resin contains acicular filler, as compared to an elastic conductive resin containing a flake conductive filler, an ultraviolet ray can penetrate into the inside of an elastic conductive bump made of the elastic conductive resin.

For example, UV curing silicone resin 3164 (trademark) made by ThreeBond Co., Ltd. may be used as the alternative elastic conductive resin. After supplying this elastic conductive resin onto an electrode, the elastic conductive resin is irradiated with an ultraviolet ray, thereby completely curing the overall elastic conductive resin. As another method of curing the alternative elastic conductive resin, first, only its surface layer is cured by ultraviolet radiation, and then the elastic conductive resin is left in a normal temperature/humidity environmental condition. In this condition, the elastic conductive resin is completely cured due to its humidity-curing property.

In the alternative elastic conductive resin, at least its surface layer can be completely cured in a short period of time. Further, by using this elastic conductive resin, an elastic conductive bump can be easily formed on an electronic part that is easily affected by heat.

In the above-described embodiment, the acicular conductive filler may be, for example, a conductive filler including an inorganic whisker as a core material, such as, a metallic whisker, a calcium carbonate whisker, and a calcium titanate whisker. The surface layer of the inorganic whisker is coated with metal. Because the core material of the acicular conductive filler can be a whisker, a conductive filler having a small diameter and a high aspect ratio can be easily made.

Further, the core material of the acicular conductive filler may be a high polymer whisker. For example, the high polymer whisker may have a diameter in a range of about 0.5 µm to about 2.0 µm, a length in a range of about 10 µm to 100 µm, and an aspect ratio in a range of about 5 to about 200. Examples of the material of the high polymer whisker include poly (p-oxybenzoyl) and poly (2-oxy-6-naphthoyl). When the core material of a conductive filler is the high polymer whisker, the specific gravity of the conductive filler is low, and the conductive filler dispersed in a rubber-like elastic resin does not tend to precipitate in the resin. Therefore, the distribution of the conductive filler in an elastic conductive element formed from the rubber-like elastic resin is even. Thus, the volume resistivity of the elastic conductive element is stabilized.

The above-described conductive rubber-like elastic resin is not limited to a silicone resin. Any resin may be used for the conductive rubber-like elastic resin so long as the resin has rubbery elasticity.

In the above-described embodiments, an elastic conductive bump is provided on an electrode on an electronic part. Alternatively, or in addition, an elastic conductive bump may be provided on an electrode on a substrate.

Particularly preferred resins useful herein are those having relatively small elasticity. For example, such resins deform when external force is applied, but has sufficient restoring force. Examples include silicone resins, and other resins, having an elasticity of preferably 10 MPa or less.

Where conductive filler is used herein, a preferred embodiment thereof is a compounding ratio of the filler in the resin of from 40-80 wt. %, more preferably 60-75 wt. %.

As used herein the term "about" preferably means ±10%. Where a range or limit is stated all values and subranges therewithin are included as if specifically written out. All articles, publication, texts, patents, applications, documents, standards, etc. mentioned herein are incorporated herein by reference.

Numerous additional modifications and variations of the present invention are possible in light of the above teachings. It is therefore to be understood that within the scope of the appended claims, the present invention may be practiced otherwise than as specifically described herein.

What is claimed is:

1. An electronic device, comprising
an electronic part comprising at least one first electrode,
a substrate comprising at least one second electrode, and
at least one bump formed on the at least one first electrode,
wherein the bump is formed from an elastic conductive resin composition,
wherein the at least one first electrode and the at least one second electrode are electrically connected to each other by physical contact of the at least one bump with the at least one second electrode, and
wherein the elastic conductive resin composition comprises an elastic resin and an acicular conductive filler, the filler comprising a surface layer of gold, silver, nickel, or copper.

2. The electronic device of claim 1, wherein the at least one bump has a shape that becomes gradually thin toward a tip portion of the at least one bump, and an aspect ratio of the at least one bump is in a range of about 0.1 to about 1.0.

3. The electronic device of claim 1, wherein the elastic resin is a silicon resin comprising an ultraviolet-curing property and a humidity-curing property.

4. An electronic device, comprising
an electronic part comprising at least one first electrode;
a substrate comprising at least one second electrode; and
at least one bump formed on the at least one second electrode;
wherein the bump is formed from an elastic conductive resin composition,
wherein the at least one first electrode and the at least one second electrode are electrically connected to each other by physical contact of the at least one bump with the at least one first electrode, and
wherein the elastic conductive resin composition comprises an elastic resin and an acicular conductive filler, the filler comprising a surface layer of gold, silver, nickel, or copper.

5. The electronic device of claim 4, wherein the at least one bump has a shape that becomes gradually thin toward a tip portion of the at least one bump, and an aspect ratio of the at least one bump is in a range of about 0.1 to about 1.0.

6. The electronic device of claim 4, wherein the elastic resin is a silicon resin comprising an ultraviolet-curing property and a humidity-curing property.

7. An electronic device, comprising
an electronic part comprising at least one first electrode;
a substrate comprising at least one second electrode;
at least one bump formed on the at least one first electrode and formed from an elastic conductive composition comprising an elastic resin and a tetrapod-shaped zinc oxide filler comprising a surface layer of gold, silver, nickel, or copper,
wherein the at least one first electrode and the at least one second electrode are electronically connected to each other by physical contact of the at least one bump with the at least one second electrode.

8. The electronic device of claim 7, wherein the at least one bump has a shape that becomes gradually thin toward a tip portion of the at least one bump, and an aspect ratio of the at least one bump is in a range of about 0.1 to about 1.0.

9. The electronic device of claim 7, wherein the elastic resin is a silicon resin comprising an ultraviolet-curing property and a humidity-curing property.

10. An electronic device, comprising
an electronic part comprising at least one first electrode;
a substrate comprising at least one second electrode;
at least one bump formed on the at least one second electrode and formed from an elastic conductive composition comprising an elastic resin and a tetrapod-shaped zinc oxide filler comprising a surface layer of gold, silver, nickel, or copper,
wherein the at least one first electrode and the at least one second electrode are electronically connected to each other by physical contact of the at least one bump with the at least one first electrode.

11. The electronic device of claim 10, wherein the at least one bump has a shape that becomes gradually thin toward a tip portion of the at least one bump, and an aspect ratio of the at least one bump is in a range of about 0.1 to about 1.0.

12. The electronic part of claim 10, wherein the elastic resin is a silicon resin comprising an ultraviolet-curing property and a humidity-curing property.

13. A connection part, comprising
an elastic conductive element formed from an elastic conductive resin composition, and
a metallic foil provided onto the elastic conductive element,
wherein the elastic conductive resin composition comprises an elastic resin and an acicular conductive filler, the filler comprising a surface layer of gold, silver, nickel, or copper.

14. An electronic part, comprising
at least one electrode; and
at least one bump formed on the at least one electrode;
wherein the bump is formed from an elastic conductive resin composition, and
wherein the elastic conductive resin composition comprises an elastic resin and an acicular conductive filler, the filler comprising a surface layer of gold, silver, nickel, or copper.

15. A substrate, comprising
at least one electrode; and
at least one bump formed on the at least one electrode;
wherein the bump is formed from an elastic resin composition, and
wherein the elastic conductive resin composition comprises an elastic resin and an acicular conductive filler, the filler comprising a surface layer of gold, silver, nickel, or copper.

* * * * *